United States Patent
Onaka et al.

(10) Patent No.: US 6,741,390 B2
(45) Date of Patent: May 25, 2004

(54) VARIABLE WAVELENGTH LIGHT SOURCE APPARATUS AND OPTICAL AMPLIFIER USING SAME

(75) Inventors: Miki Onaka, Kawasaki (JP); Etsuko Hayashi, Kawasaki (JP); Hiroshi Onaka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/347,624

(22) Filed: Jan. 22, 2003

(65) Prior Publication Data

US 2003/0206336 A1 Nov. 6, 2003

(30) Foreign Application Priority Data

May 2, 2002  (JP) ....................................... 2002-130492

(51) Int. Cl.⁷ ................................................. H01S 3/00
(52) U.S. Cl. ................................. 359/334; 359/341.33
(58) Field of Search ............................. 359/334, 341.33

(56) References Cited

U.S. PATENT DOCUMENTS

| | | | |
|---|---|---|---|
| 5,936,763 A | * | 8/1999 | Mitsuda et al. ......... 359/341.33 |
| 6,141,466 A | | 10/2000 | Shigehara |
| 6,433,921 B1 | * | 8/2002 | Wu et al. .................... 359/334 |
| 6,657,775 B1 | * | 12/2003 | Farmer et al. .............. 359/334 |
| 6,687,043 B2 | * | 2/2004 | Davies ....................... 359/334 |
| 6,690,504 B1 | * | 2/2004 | Nagel et al. ................ 359/334 |

FOREIGN PATENT DOCUMENTS

| | | |
|---|---|---|
| JP | 60-095508 | 5/1985 |
| JP | 62-279306 | 12/1987 |
| JP | 64-047005 | 2/1989 |
| JP | 10-267791 | 10/1998 |
| JP | 11307864 A | * 11/1999 |
| JP | 2000-286503 | 10/2000 |
| JP | 2003198056 A | * 7/2003 |

* cited by examiner

Primary Examiner—Mark Hellner
(74) Attorney, Agent, or Firm—Staas & Halsey LLP

(57) ABSTRACT

It is an object of the present invention to provide a variable wavelength light source apparatus capable of changing continuously wavelengths of a plurality of oscillation light over a wideband and an optical amplifier using the same. In order to achieve the above object, the variable wavelength light source apparatus comprises: a wavelength selection device in which a propagation direction of emitted light is changed according to a wavelength of incident light; a plurality of light sources emitting the light that has reciprocated in a gain medium with a high reflecting mirror on an end face thereof and has been amplified, to a predetermined position of the wavelength selection device at angles different from each other; an optical resonance reflection section reflecting a part of the light incident vertically out of the emitted light from the wavelength selection device to form an optical resonator configuration between the optical resonance reflection section and each of the high reflecting mirrors of the light sources to generate oscillation light; an optical coupler section coupling the oscillation light transmitted through the optical resonance reflection section in an output light path; and a drive section changing an arrangement angle of the wavelength selection device with respect to the optical resonance reflection section according to desired wavelength setting.

11 Claims, 6 Drawing Sheets

(A) (B)

VARIABLE WAVELENGTH LIGHT SOURCE APPARATUS AND OPTICAL AMPLIFIER USING SAME

BACKGROUND OF THE INVENTION

1. Field of the Invention

The present invention relates to a variable wavelength light source apparatus and an optical amplifier using the same, which are used in various optical communication systems, and in particular, to a variable wavelength light source apparatus capable of changing continuously wavelengths of a plurality of oscillation light over a wideband, and an optical amplifier constituting a pumping system using such an apparatus.

2. Description of the Related Art

For example, in a wavelength division multiplexing (WDM) optical fiber communication system, an optical amplification technique is one of key technologies, and an erbium (Er) doped optical fiber amplifier (EDFA) and the like are typically used in conventional systems. Further, as the Internet comes into widespread use in recent years, demand for networks increases explosively and an optical fiber communication system is required to have larger capacity and a longer distance. A Raman amplifier becomes practical as a main optical amplification technique for realizing such requirements. By using the Raman amplifier and the EDFA together, it becomes possible to realize a transmission characteristic of higher quality than that in the case where the EDFA is used alone, and therefore the Raman amplifier is expected to be indispensable technique in a long-distance transmission system.

For the Raman amplifier mentioned above, there are two amplification types: a distributed parameter type and a concentrated type. The distributed parameter type is the one in which pumping light is introduced into a transmission path (for example, a silica-based fiber and the like) of an optical communication system to Raman amplify distributively an optical signal being propagated in the transmission path, so that a part of transmission losses is compensated. On the other hand, the concentrated type is the one in which the pumping light is introduced concentratingly into a medium having higher non-linearity (for example, a silica-based fiber having a smaller effective cross-sectional area) to Raman amplify the optical signal efficiently. It is known that the Raman amplification described above includes characteristics having a gain peak at a frequency lower than a frequency of the pumping light by 13.2 THz in the case where the silica-based fiber is used as a medium. Therefore, the Raman amplifier has advantages capable to amplify an optical signal of arbitrary frequency according to a wavelength of pumping light. Further, by adopting a pumping system configuration in which a plurality of pumping light sources of different wavelengths are prepared and each pumping light is multiplexed to be supplied to an amplification medium, it becomes possible to realize a wider Raman amplification bandwidth, and such a Raman amplifier also becomes practical.

As pumping system components in the Raman amplifier as described above, typically, a semiconductor laser or the like is used as a pumping light source, and an interference film, a fused coupler or a Mach-Zehnder type optical filter is used as a multiplexer for multiplexing pumping light of each wavelength. For such a Raman amplifier using such pumping system components, in the case where the pumping wavelength is made to be variable over a wideband (for example, several nm or more) so as to enable the amplification of an optical signal of an arbitrary wavelength band, needless to say, multiplexing wavelength characteristics of the multiplexer is also required to be variable in accordance with a change in the pumping wavelength.

Conventional multiplexers having multiplexing wavelength characteristics variable are well known in Japanese Unexamined Patent Publication No. 56-113102, Japanese Unexamined Utility Model Publication No. 60-104804, and the like. Each of such conventional multiplexers is configured to utilize the interference film, in which, specifically, films having different transmission characteristics are deposited on the same substrate and a predetermined film is selected by making the substrate movable.

However, since each of the conventional multiplexers described above cannot change multiplexing wavelength characteristics continuously as if arbitrary wavelengths, even if the Raman amplifier having a pumping wavelength variable is constituted using the conventional pumping system components, it is practically difficult to have wavelengths of a plurality of pumping light variable continuously over a wideband.

In an optical network system of next-generation, for example, it is assumed that system operating conditions such as a signal band, the number of signals, a signal input level and a type of a transmission path may be changed dynamically. Therefore, for a Raman amplifier applied to such a system, in order to maintain a good transmission quality of each signal channel, it is required that a spectrum of pumping light (specifically, the number of peak wavelengths, a center wavelength, bandwidth, pumping light power, and the like) can be optimized accurately according to the system operating conditions that are changed dynamically.

On the other hand, with regard to a pumping wavelength control of the Raman amplifier, Japanese Unexamined Patent Publication No. 2001-235772 discloses that the pumping wavelength is made variable. However, the means for having the pumping wavelength variable in this known technique, is to change the pumping wavelength by adjusting an operation temperature of a pumping light source and the variable width of the pumping wavelength is specifically a narrow band of on the order of 0.1 nm/° C. Therefore, it is still difficult to have the pumping wavelength variable continuously over a wideband of on the order of several nm or more as described above, and it is also still difficult to flexibly cope with the system operating conditions that are changed dynamically.

SUMMARY OF THE INVENTION

In view of the above problems, it is an object of the present invention to realize a variable wavelength light source apparatus capable of varying continuously a plurality of oscillation wavelengths over a wideband. Further, it is a further object of the present invention to provide an optical amplifier that can support a wide system operation range and also can cope with a change in system operating conditions smoothly by constituting a pumping system using the variable wavelength light source apparatus as described above.

In order to achieve the above objects, a variable wavelength light source apparatus according to the present invention, for multiplexing a plurality of variable wavelength light to output multiplexed light, comprises: a wavelength selection device in which a propagation direction of emitted light is changed according to a wavelength of incident light; a plurality of light source sections, each including a gain medium that amplifies light and a reflection component that reflects the light incident on one end and emitted from the other end of the gain medium, to return the light to the other end, and emitting the light that has reciprocated in the gain medium and has been amplified, to a predetermined position of the wavelength selection device at angles different from each other; an optical resonance reflection section including a light incident surface on which the emitted light from the wavelength selection device enters, that reflects a part of the light incident vertically on the light incident surface to form an optical resonator configuration between the optical resonance reflection section and each of the reflection components of the light source sections, to generate oscillation light; an optical coupler section coupling the oscillation light transmitted through the optical resonance reflection section in an output light path; and a wavelength selection device drive section changing an arrangement angle of the wavelength selection device with respect to the optical resonance reflection section with the predetermined position as a center.

In the variable wavelength light source apparatus of the above constitution, since the light emitted from each light source section enters the predetermined position of the wavelength selection device at the different angles and is emitted toward the light incident surface of the optical resonance reflection section, and only the light incident vertically on the light incident surface of the optical resonance reflection section is reflected and resonates between the optical resonance reflection section and each of the reflection components of the light source sections to oscillate. A wavelength of each light that oscillates by each optical resonator configuration between the optical resonance reflection section and each of the reflection components of the light source sections is made variable by changing the arrangement angle of the wavelength selection device with respect to the optical resonance reflection section by the wavelength selection device drive section. Thus, the light that has been transmitted through the optical resonance reflection section and introduced through the optical coupler section to the output light path becomes light in which a plurality of oscillation light, wavelengths of which can be changed continuously over a wideband, is multiplexed.

Further, the variable wavelength light source apparatus described above may comprise a light source drive section changing an emission angle of the light directed to the predetermined position of the wavelength selection device, for at least one or more of the plurality of the light source sections. Thus, an interval between the oscillation wavelengths corresponding to each light source section can be varied.

Still further, the variable wavelength light source apparatus described above may comprise a monitoring section detecting a wavelength of the oscillation light coupled in the output light path, and a control section controlling the wavelength selection device drive section or the light source drive section according to the wavelength detected by the monitoring section. In such a constitution, since the arrangement angle of the wavelength selection device and the light emission angle of each of the light source sections are feedback controlled according to the oscillation wavelength of the multiplexed light that is actually output from the output light path, and fluctuation of the oscillation wavelengths due to environmental variation and the like is corrected, light of a desired oscillation wavelength can be output stably.

The variable wavelength light source apparatus according to the present invention as described above is suitable, for example, as a pumping light source for various optical amplifiers such as a Raman amplifier. According to such optical amplifiers, since wavelengths of a plurality of pumping light can be changed continuously over a wideband, amplification of signal light operated in a wide wavelength band can be realized by a single pumping light source.

The other objects, features and advantages of the present invention will be apparent from the following description of the embodiments with reference to the accompanying drawings.

DETAILED DESCRIPTION OF THE INVENTION

Figure 1:
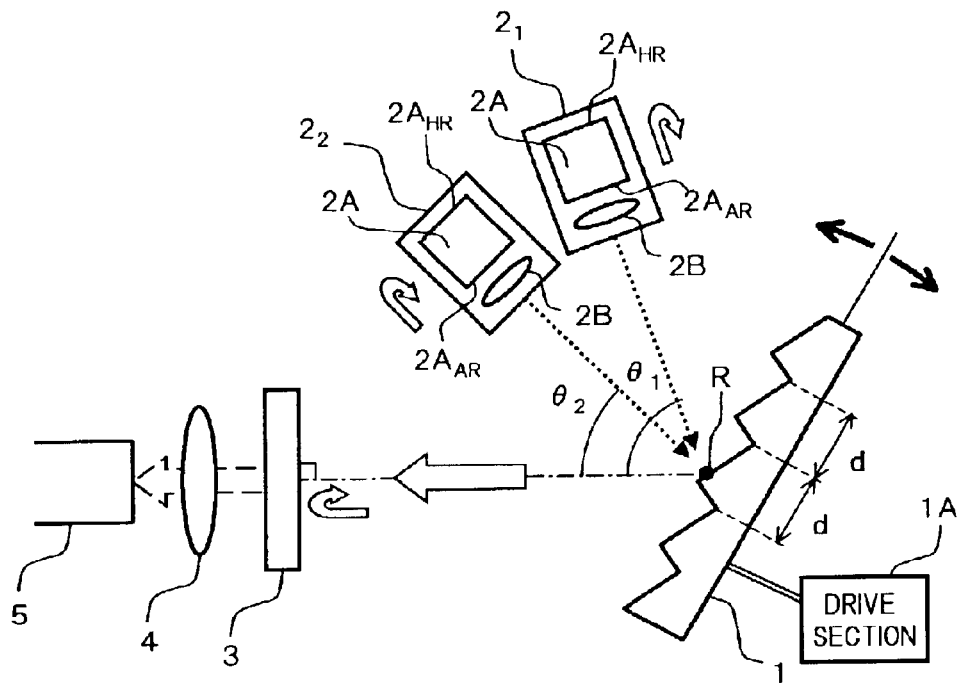
FIG. 1 is a plan view showing a constitution of a first embodiment of a variable wavelength light source apparatus according to the present invention.

Hereinafter, embodiments of the present invention will be described with reference to drawings. In each drawing, same components are denoted by the same reference numerals, and the description thereof is omitted.

FIG. 1 is a plan view showing a constitution of a first embodiment of a variable wavelength light source apparatus according to the present invention.

In FIG. 1, the variable wavelength light source apparatus comprises, for example, a diffraction grating 1 as a wavelength selection device, a plurality of (two in this embodiment) light sources $2_1$ and $2_2$, a half mirror 3 as an optical resonance reflection section, a lens 4 as an optical coupler section, and an optical fiber 5 as an output light path.

The diffraction grating 1 is a typical reflection type diffraction grating constructed such that, for example, grooves of equally spaced by a distance "d" are formed on a substrate surface and a metal film or the like is deposited on the resultant concave-convex surface. This diffraction grating 1 is disposed at an intermediate position between an optical resonator configuration formed by the light sources $2_1$, $2_2$ and the half mirror 3 as described later, and reflects light sent from each of the light sources $2_1$, $2_2$ and the half mirror 3 at a reflection point R. Further, the diffraction grating 1 is provided with a drive section 1A. The drive section 1A is able to rotate the diffraction grating 1 with the reflection point R as a center, and a rotation angle of the diffraction grating 1 is set according to an oscillation wavelength as described later. It is possible to apply a well-known drive mechanism such as a motor control to rotate the diffraction grating 1 mechanically, to the drive of the diffraction grating 1 by the drive section 1A. Such a drive mechanism has been already applied, for example, to a single-wavelength variable wavelength light source and the like.

Each of the light sources $2_1$ and $2_2$ includes, for example, a gain medium 2A and a lens 2B. The gain medium 2A is formed with an antireflection film $2A_{AR}$ on one end face thereof and a high reflecting mirror $2A_{HR}$ as a reflection component on other end face thereof so that the light being propagated in the medium is amplified to be output from the end face on which the antireflection film $2A_{AR}$ is formed. As a specific example of the gain medium 2A, it is possible to use a typical gain medium such as a semiconductor laser chip or the like. The lens 2B collimates the light emitted from the gain medium 2A to send it toward the reflection point R of the diffraction grating 1. Here, in this embodiment, it is assumed that each of the light sources $2_1$, and $2_2$ is fixed at a predetermined position, and an axial direction of the emission light is not changed.

The half mirror 3 is disposed so as to face the diffraction grating 1 and reflects a part of the light reflected at the reflection point R of the diffraction grating 1 and incident vertically on the half mirror 3, so that the optical resonator configuration is formed between the half mirror 3 and each of the high reflecting mirrors $2A_{HR}$ of the light sources $2_1$ and $2_2$. The light transmitted through the half mirror 3 is condensed on a core end face of the optical fiber 5 via the lens 4.

Here, in the variable wavelength light source apparatus of the constitution described above, in order to reduce affects by, a change in environmental temperature, the respective optical components such as the diffraction grating 1, the light sources $2_1$ and $2_2$, the half mirror 3 and the lens 4 may be integrated to be controlled at a constant temperature. Further, in order to reduce affects due to a change in environmental humidity, the respective optical components may be packaged in a vacuum tube and the like.

Next, an operation of the first embodiment will be described. First, a basic function of a typical reflection type diffraction grating will be described since such a description is useful for understanding the operation of the present variable wavelength light source apparatus.

Figure 2:
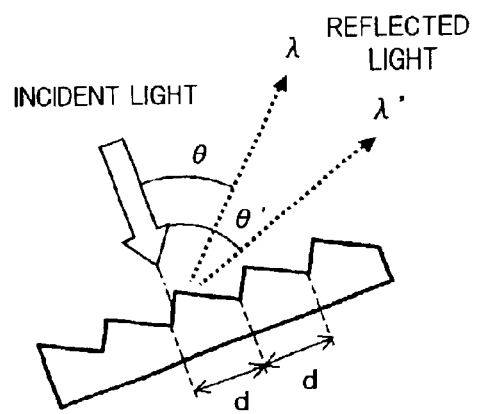
FIG. 2 is a diagram for explaining a basic function of a typical reflection type diffraction grating.

As shown in FIG. 2, in the reflection type diffraction grating, a reflection angle of the light incident on a diffraction grating surface differs depending on the wavelength of the incident light. With regard to this reflection angle, a relationship as shown in the equation (1) is established assuming that a distance between gratings of the diffraction grating is "d", a wavelength of the incident light is $\lambda$, an angle between the incident light and the reflected light is $\theta$, and the diffraction order is "m" (m is a positive or negative integer):

$$d \times \sin\theta = m \times \lambda \tag{1}$$

This variable wavelength light source apparatus utilizes the diffraction grating having the spectrometric function as described above not as a spectrometer but as a multiplexer. Namely, in this variable wavelength light source apparatus, an optical system is structured so that the light emitted from each of the light sources $2_1$ and $2_2$ is reflected at the reflection point R of the diffraction grating 1 to enter on the half mirror 3. Only the light incident vertically on the half mirror 3 reciprocates between the half mirror 3 and the high reflecting mirror $2A_{HR}$ of each of the light sources $2_1$ and $2_2$ and is amplified in the gain medium 2A of each of the light sources $2_1$ and $2_2$, to oscillate. Then, a part of each oscillation light is transmitted through the half mirror 3 and condensed on the core end face of the optical fiber 5 by the lens 4 so that the multiplexed light of two waves is output from the optical fiber 5.

A wavelength of the light output from this variable wavelength light source apparatus, in other words, an oscillation wavelength corresponding to each of the light sources $2_1$ and $2_2$ is determined by a light emission angle of each of the light sources $2_1$, and $2_2$ and an arrangement angle of the diffraction grating 1. Therefore, in this variable wavelength light source apparatus, for example, the light emission angle of each of the light sources $2_1$ and $2_2$ and the arrangement angle of the diffraction grating 1 are obtained as initial values by calculating back from a desired oscillation wavelength, and then the respective component are arranged at required positions based on the initial values. In this case, the diffraction grating 1 is rotated by the drive section 1A so that each oscillation wavelength is changed continuously over a wideband.

Here, the angle adjustment of the diffraction grating 1 corresponding to the oscillation wavelength in this variable wavelength light source apparatus will be described specifically.

First, the equation (1) mentioned above is subjected to Taylor's expansion (Maclaurin's expansion) of the reflected light angle $\theta$, to obtain the following equation (2). Here, the order of diffraction "m" is assumed to be 1:

$$\theta = \sin^{-1}(\lambda/d) = \lambda/d + 1/6 \times (\lambda/d)^3 + 3/40 \times (\lambda/d)^5 + \tag{2}$$

For the apparatus constitution shown in FIG. 1, for example, in the case where the wavelength of the light incident vertically on the half mirror 3 from the light source $2_1$, via the half mirror 3 is changed from $\lambda 1$ to $\lambda 1'$, a change amount in the angle of the diffraction grating 1 can be calculated using the above equation (2). Namely, assuming that the angle between a normal line of the half mirror 3 and a light emission direction of the light source $2_1$ is $\theta 1$ for the wavelength $\lambda 1$, and $\theta 1'$ for the wavelength $\lambda 1'$, each angle $\theta 1$ and $\theta 1'$ can be expressed by the following equations (3) and (4), respectively, by using the equation (2).

$$\theta 1 = \sin^{-1}(\lambda 1/d) = \lambda 1/d + 1/6 \times (\lambda 1/d)^3 + 3/40 \times (\lambda 1/d)^5 + \tag{3}$$

$$\theta 1' = \sin^{-1}(\lambda 1'/d) = \lambda 1'/d + 1/6 \times (\lambda 1'/d)^3 + 3/40 \times (\lambda 1'/d)^5 + \tag{4}$$

Therefore, in the case where the wavelength of the light incident vertically on the half mirror 3 is changed from $\lambda 1$ to λ1', the change amount in the angle of the diffraction grating 1 becomes |θ1−θ1'|, and this change amount can be expressed by the equation (5) using the equations (3) and (4) above.

$$|\theta 1-\theta 1'|=|(\sin^{-1}(\lambda 1/d)-\sin^{-1}(\lambda 1'/d)|=|(\lambda 1-\lambda 1')/d+(\lambda 1^3-\lambda 1'^3)/6d^3+3(^5\lambda 1-\lambda 1'^5)/40d^5+ \quad (5)$$

For example, the consideration is specifically made on the case where 5000 grooves per 1 cm are formed on the diffraction grating 1 and the oscillation wavelength is varied from 1490 nm to 1390 nm. In this case, the distance "d" between gratings (in "m" unit) is expressed by the following equation.

$$d=(5001)^{-1}\times 10^{-2}=2\times 10^{-6}$$

When the distance "d" between gratings is substituted into the equations (3) and (4) to obtain the angle θ1 for when the oscillation wavelength λ1 is 1490 nm and the angle θ1' for when the oscillation wavelength λ1' is 1390 nm, respectively, the results are: θ1=48.159° and θ1'=44.027°. Therefore, in the above setting conditions, by changing the angle of the diffraction grating by 4.132° (=48.159°−44.027°), the oscillation wavelength can be varied from 1490 nm to 1390 nm.

In the above specific example, the description has been made on the case where the order of diffraction "m" is 1. For the case of the second or higher order of diffraction, since a wavelength of higher-order diffracted light greatly departs from the wavelength of the first-order diffracted light, it is considered that the higher-order diffracted light hardly affects the first-order diffracted light. But, when it is necessary to consider the affects of the higher-order diffracted light, any measure may be taken, for example, an optical filter capable of blocking the higher-order diffracted light may be applied to the half mirror 3.

Further, in the above specific example, although the description has been made on only the light source $2_1$, an oscillation wavelength of the other light source $2_2$ is also varied with the rotation of the diffraction grating 1. In the constitution of this embodiment, since the light emission angles of the respective light sources $2_1$ and $2_2$ are fixed, the oscillation wavelength λ1 corresponding to the light source $2_1$ and the oscillation wavelength λ2 corresponding to the light source $2_2$ are shifted (wavelength varied) to the oscillation wavelengths λ1' and λ2', respectively, with the rotation of the diffraction grating 1, while keeping a fixed wavelength interval A (=λ2−λ1=λ2'−λ1') as shown in (A) and (B) of FIG. 3, for example.

Figure 3:
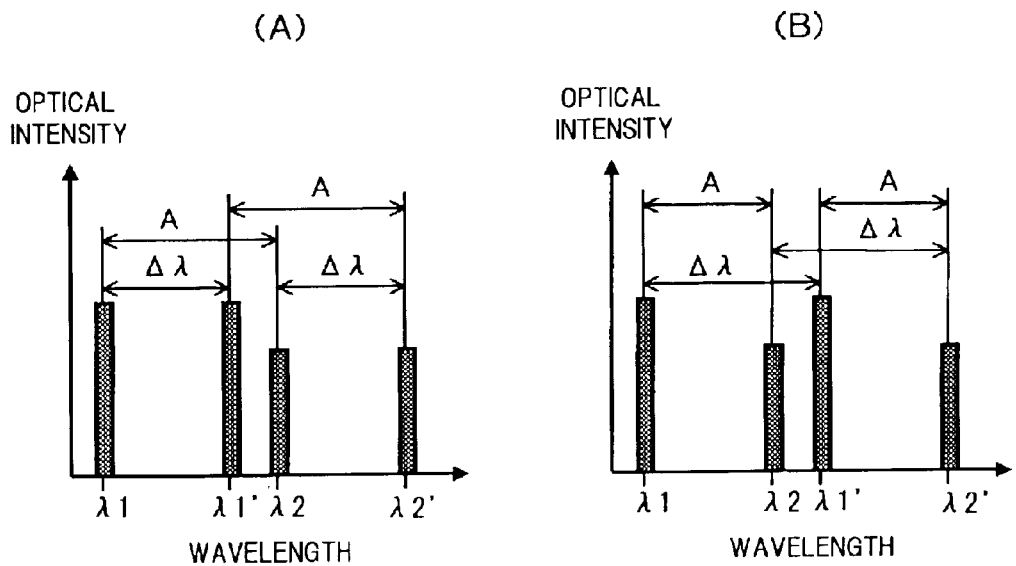
FIG. 3 is a diagram showing an example of variation of an oscillation wavelength in the first embodiment described above, in which (A) shows the case where a wavelength interval between oscillation wavelengths is larger than a shift amount of each oscillation wavelength, while (B) shows the case where the wavelength interval between the oscillation wavelengths is smaller than the shift amount of each oscillation wavelength.

Incidentally, (A) of FIG. 3 shows the case where the oscillation wavelength λ1' after the shift does not exceed the oscillation wavelength λ2 before the shift, that is, the above fixed wavelength interval A is wider than a shift amount Δλ of each oscillation wavelength (=λ1'−λ1=λ2'−λ2). On the other hand, (B) of FIG. 3 shows the case where the oscillation wavelength λ1' after the shift exceeds the oscillation wavelength λ2 before the shift, that is, the above fixed wavelength interval A is narrower than the shift amount Δλ of each oscillation wavelength.

Here, increase of optical power that is output from this variable wavelength light source apparatus will be described briefly.

In order to increase the optical output power, it is necessary to increase a gain of each of the light sources $2_1$ and $2_2$ and reduce a loss in the optical system of from an output end of the gain medium 2A to a condensing position of the optical fiber 5. With regard to the former, it is effective to apply a known high-power semiconductor laser and the like to each of the light sources $2_1$ and $2_2$. On the other hand, with regard to the latter, it is effective to perform the reduction of a reflection loss of the diffraction grating 1, the optimization of lens coupling efficiency, the reduction of resonance length between the half mirror 3 and the high reflecting mirror $2A_{HR}$, and the like. More specifically, since it is considered that the loss in the optical system of the known variable wavelength light source apparatus is typically 3–7 dB, even if the loss in the optical system of the present variable wavelength light source apparatus is 7 dB, for example, assuming that a chip (for example, 700 mW chip output) used in a high-power semiconductor laser that has been in practical use is applied to the gain medium 2A of the present variable wavelength light source apparatus, the optical power at the condensing position of the optical fiber 5 is about 140 mW per one oscillation wavelength. Therefore, the output light of this variable wavelength light source apparatus constituted by using a plurality of light sources can satisfy the power level that is applicable, for example, as pumping light for a typical Raman amplifier.

As described above, according to the variable wavelength light source apparatus according to the first embodiment, the diffraction grating 1 is rotated by the drive section 1A, to change the arrangement angle of the diffraction grating 1 and to vary the wavelengths of the plurality of light incident vertically on the half mirror 3. Thus, in contrast to the conventional constitution in which the variable wavelength light source and the multiplexer are incorporated separately, it becomes possible to easily realize the constitution in which the variable wavelength light source and the multiplexer are integrated, and also it becomes possible to vary continuously the oscillation wavelengths λ1 and λ2 corresponding to the light sources $2_1$ and $2_2$, respectively, over a wideband according to setting accuracy of the rotation angle of the diffraction grating 1. Further, by using the diffraction grating 1, a variable wavelength range of each of the oscillation wavelengths λ1 and λ2 becomes extremely wider than the conventional case using the temperature control of light source and the like, and in the most recent technique, an upper limit value of the variable wavelength range is determined by a gain band of the gain medium 2A (for example, about 100 nm). Still further, for the optical power output from the variable wavelength light source apparatus, it is possible to control separately and continuously the gains in the gain mediums 2A of the light sources $2_1$ and $2_2$ by adjusting a supply amount of driving current, for example.

Figure 4:
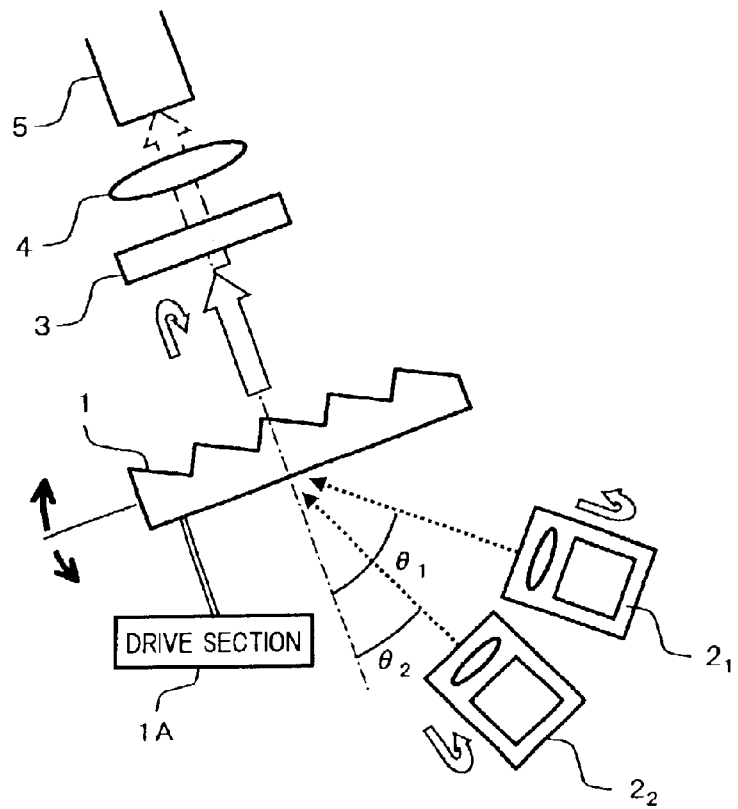
FIG. 4 is a schematic diagram showing an example of a variable wavelength light source apparatus using a transmission type diffraction grating in connection with the first embodiment described above.

In the first embodiment described above, the description has been made on the case where the reflection type diffraction grating is used as the wavelength selection device. However, the present invention is not limited thereto and a transmission type diffraction grating or other known devices having wavelength selection function can be applied. FIG. 4 shows an example of the variable wavelength light source apparatus constituted by using the transmission type diffraction grating.

Figure 5:
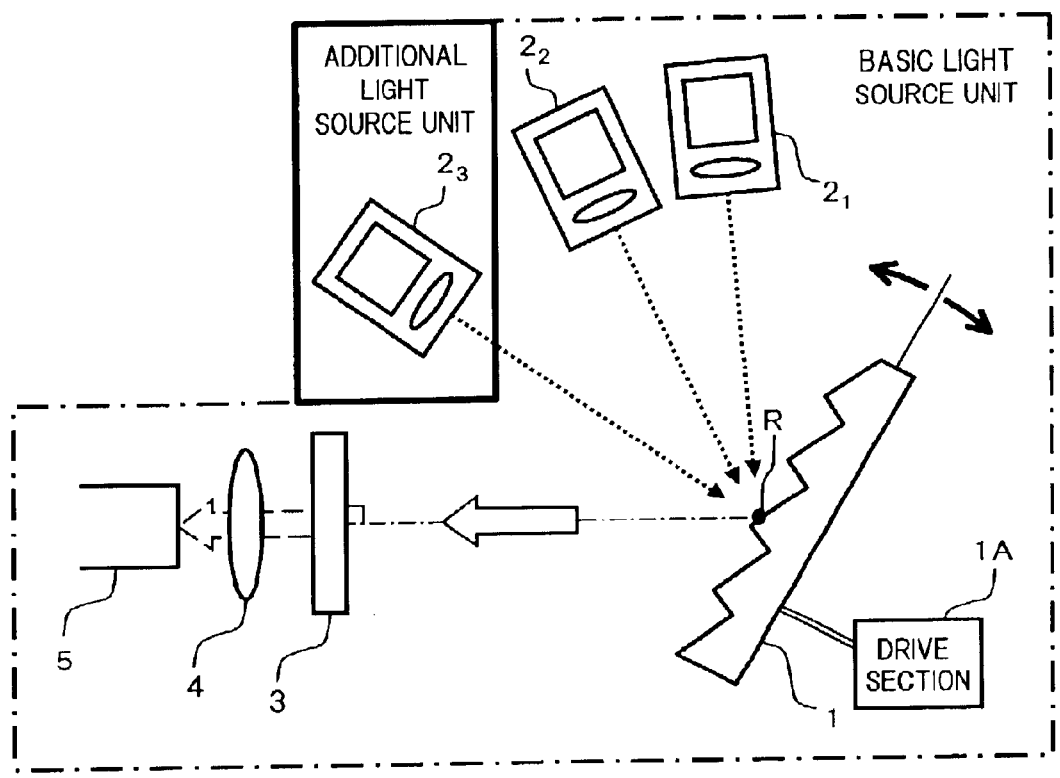
FIG. 5 is a schematic diagram showing an example in connection with the first embodiment described above, wherein light source sections are made in a unit so as to enable to respond to the addition of light source sections.

Further, in the first embodiment described above, the description has been made on the case where the number of oscillation wavelengths is set to two waves by using the two light sources $2_1$ and $2_2$. However, the present invention is not limited thereto and the number of oscillation wavelengths can be set arbitrarily by increasing the number of light sources. Further, in consideration of a possibility that the number of oscillation wavelengths would be more than previously expected, a constitution in which the optical sources in this variable wavelength light source apparatus is made to be a unit so that more optical source units can be readily added. More specifically, as shown in FIG. 5 for example, a constitution in which the constitution of the first embodiment described above is incorporated as a basic light source unit and additional light source units are added to the basic light source unit is possible.

Here, constraint on the setting of the number of oscillation wavelengths in the variable wavelength light source apparatus according to the present invention will be described.

An upper limit of the number of oscillation wavelengths of the present variable wavelength light source apparatus is determined by each oscillation wavelength and the interval between the oscillation wavelengths, the distance "d" between gratings of the diffraction grating, and a size of each light source and its arrangement (distance to the diffractive grating). More specifically, the narrower the interval between the oscillation wavelengths is, the smaller a difference between the light emission angles of the light sources to the diffraction grating is, and therefore physical limitations will occur depending on the size of each light source and its arrangement.

For example, typically, dimensions of a 1.4 μm InGaAsP/InP-based semiconductor laser chip are 250–300 μm in width, 800–1000 μm in length and 100–150 μm in height. Assuming that a minimum distance between the light sources $2_1$ and $2_2$ each using the semiconductor laser chip of such dimensions as gain mediums is 300 μm, 6500 grooves are formed per 1 cm on the diffraction grating 1 (the distance between the grooves "d"=$1.54 \times 10^{-6}$ m) and the oscillation wavelengths are set to 1430 nm and 1460 nm, respectively, the light sources $2_1$ and $2_2$ are required to be disposed so that the difference between the light emission angles of the light sources toward the reflection point R of the diffraction grating 1 is 3.27° (71.65°–68.38°). In this case, the distance between each light source and the diffraction grating may be about 5.26 mm (=300 μm/sin 3.27). However, when the oscillation wavelengths are set to, for example, 1428 nm and 1430 nm, respectively, the light sources $2_1$ and $2_2$ are required to be disposed so that the difference between the light emission angles of the light sources is a very small value such as 0.2° (68.18°–68.38°), as a result, the distance between each light source and the diffraction grating 1 will be about 86 mm (=300 μm/sin 0.2°). In such a case, a resonant length of the light becomes longer, leading the increase in the loss and the growth in size of this variable wavelength light source itself (the plurality of light sources and the multiplexer). Therefore, it is desired that the interval between the oscillation wavelengths is kept to be several nm or more in this variable wavelength light source apparatus.

Further, in the above discussion, it has been assumed that the light sources $2_1$ and $2_2$ are disposed on the identical plane. However, it is also possible to remove the sources $2_1$ and $2_2$ from the identical plane to be disposed in three-dimensions according to a region of the reflection point R of the diffraction grating 1, depending on tolerance of a required region in which the light transmitted through the half mirror 3 can be coupled on the core of the optical fiber 5.

Still further, in the case where it is necessary to set the resonant length of the light to be relatively longer corresponding to the narrow interval between the oscillation wavelengths, since spectral line width of the light becomes narrower, it is also effective to increase the spectral line width by subjecting the driving current of the light sources to the modulation of about 1 MHz as needed.

Next, a second embodiment of the variable wavelength light source apparatus according to the present invention will be described.

Figure 6:
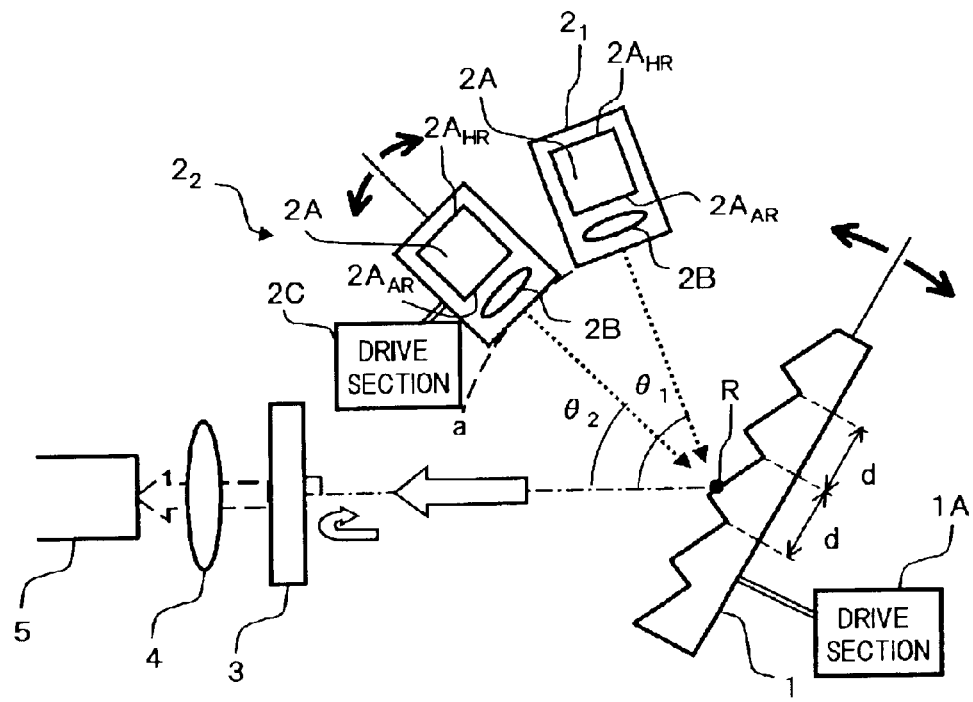
FIG. 6 is a plan view showing a constitution of a second embodiment of the variable wavelength light source apparatus according to the present invention.

FIG. 6 is a plan view showing a constitution of the variable wavelength light source apparatus in the second embodiment.

In FIG. 6, a difference of this variable wavelength light source apparatus from the first embodiment shown in FIG. 1 above is in that the light source $2_1$ is defined as a reference light source and the light source $2_2$ is provided with a drive section 2C. Other components than the above are the same as those in the first embodiment.

The drive section 2C changes the light emission angle of the light source $2_2$ that is disposed on a movable stage and the like (not shown in the figure), by moving the movable stage by a motor control and the like. More specifically, the light source $2_2$ is moved by the drive section 2C so that a light emission plane of the light source $2_2$ is positioned on a circular arc "a" with the reflection point R of the diffraction grating 1 as a center.

Figure 7:
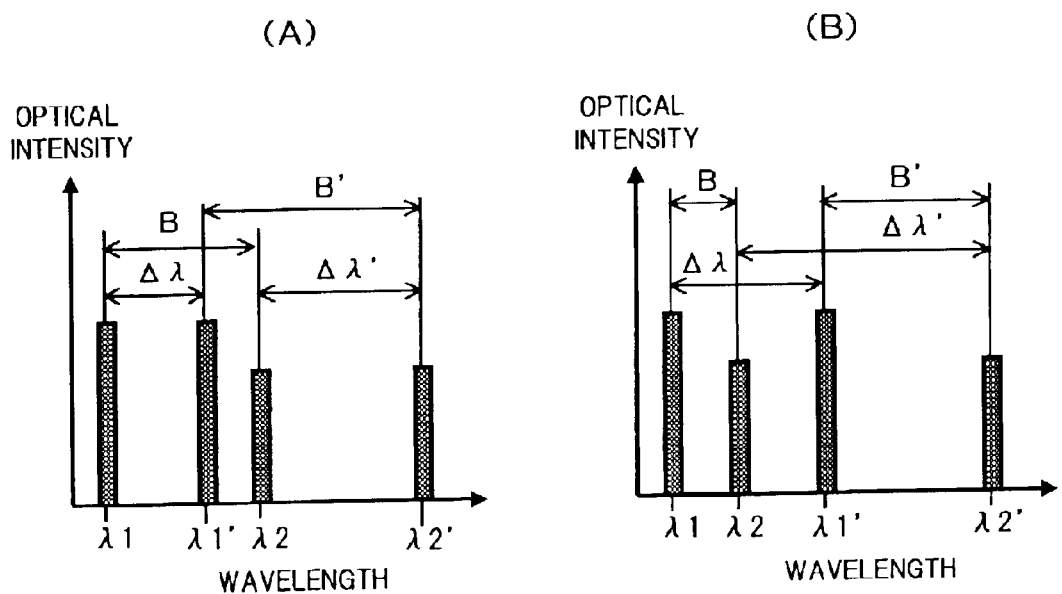
FIG. 7 is a diagram showing an example of variation of an oscillation wavelength in the second embodiment described above, in which (A) shows the case where an oscillation wavelength $\lambda 1'$ after varied does not exceed another oscillation wavelength $\lambda 2$ before varied, while (B) shows the case where the oscillation wavelength $\lambda 1'$ after varied exceeds another oscillation wavelength $\lambda 2$ before varied.

In the variable wavelength light source apparatus constituted as described above, since the light emission angle of the light source $2_2$ can be changed in addition to the arrangement angle of the diffraction grating 1, it becomes also possible to vary the relationship of the oscillation wavelength λ2 corresponding to the light source $2_2$ to the oscillation wavelength λ1 corresponding to the light source $2_1$, that is, the interval between the oscillation wavelengths λ1 and λ2. For example, as shown in (A) and (B) of FIG. 7, it becomes possible to make an interval B between the wavelengths λ1' and λ2' after the oscillation wavelength being varied to be different from an interval B between the wavelengths λ1 and λ2 before the oscillation wavelength being varied. Note, (A) of FIG. 7 shows the case where the oscillation wavelength λ1' after being varied does not exceed the oscillation wavelength λ2 before being varied, and (B) of FIG. 7 shows the case where the oscillation wavelength λ1' after being varied exceeds the oscillation wavelength λ2 before being varied.

As described above, according to the variable wavelength light source apparatus of the second embodiment, since the light emission angle of the light source $2_2$ is made variable, the interval between the oscillation wavelengths can also be changed continuously.

In the second embodiment described above, although the light source $2_1$ is defined as the reference light source and the light source $2_2$ is provided with the drive section 2C. However, alternatively, the constitution may be such that the light source $2_2$ is defined as the reference light source and the light source $2_1$ is provided with the drive section 2C. Further, in the case where three or more light sources are used, it is also possible to define one of these light sources as the reference light source and provide the drive section 2C to at least one of remaining light sources.

Next, a third embodiment of the variable wavelength light source apparatus according to the present invention will be described.

Figure 8:
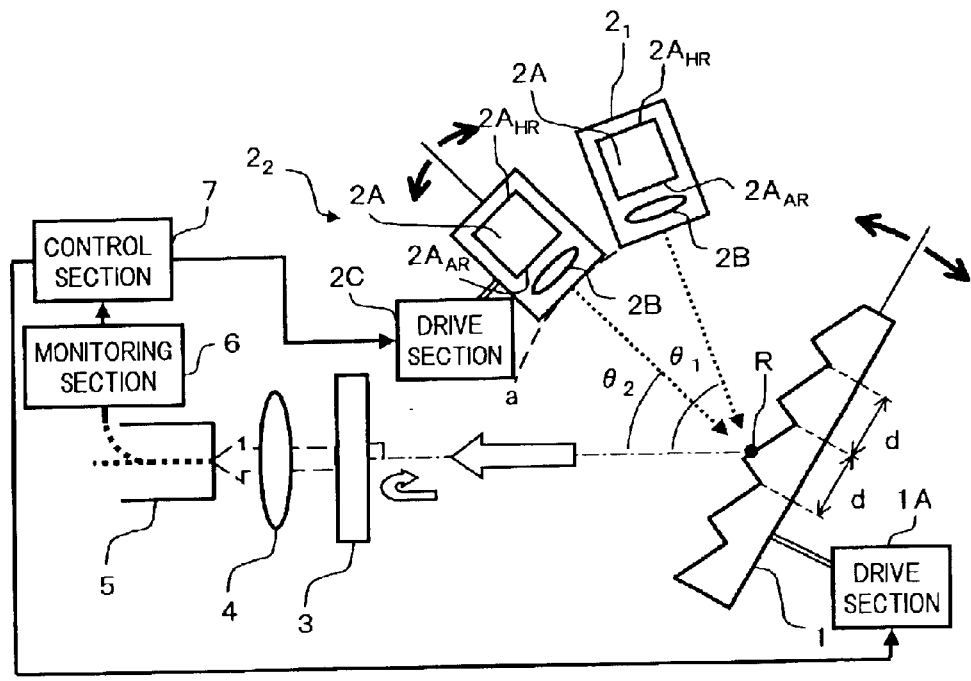
FIG. 8 is a plan view showing a constitution of a third embodiment of the variable wavelength light source apparatus according to the present invention.

FIG. 8 is a plan view showing a constitution of the variable wavelength light source apparatus in the third embodiment.

In FIG. 8, this variable wavelength light source apparatus is constituted so that a monitoring section 6 and a control section 7 are added to the constitution of the second embodiment shown in FIG. 6 above, for example, for feedback controlling each of the drive sections 1A and 2C based on actual output light.

The monitoring section 6 branches a part of the light condensed on the core end face of the optical fiber 5 and monitors a wavelength of each oscillation light included in the branched light. Based on each oscillation wavelength monitored by the monitoring section 6, the control section 7 adjusts driving conditions of the drive sections 1A and 2C, respectively, to feedback control the arrangement angle of the diffraction grating 1 and the light emission angle of the light source $2_2$ so that the oscillation wavelength of the light that is output actually coincides with a desired value. In the control section 7, information about the optical system such as the arrangement of each light source $2_1$ and $2_2$ with respect to the reflection point R of the diffraction grating 1 is set in advance, and based on such information, control values of the arrangement angle of the diffraction grating 1 and the light emission angle of the light source $2_2$ are calculated for correcting a deviation between the actual oscillation wavelength monitored by the monitoring section 6 and the desired oscillation wavelength.

According to such a variable wavelength light source apparatus, since the arrangement angle of the diffraction grating 1 and the light emission angle of the light source $2_2$ are feedback controlled according to the oscillation wavelength of the light that is actually multiplexed to be output, so that fluctuation of the oscillation wavelength due to environmental changes, a change with aging and the like, for example, can be corrected, thereby enabling to output stably the light of the desired oscillation wavelength.

In the third embodiment described above, the feedback control is performed for the second embodiment described above. However, this feedback control can be applied to the first embodiment described above similarly. In this case, by monitoring a wavelength of one oscillation light being a reference among the respective oscillation light actually output, it is possible to feedback control the arrangement angle of the diffraction grating 1.

Further, in the third embodiment, the control values of the arrangement angle of the diffractive grating 1 and the light emission angle of the light source $2_2$ are calculated by the control section 7. However, the constitution may be such that control values with respect to assumed oscillation wavelengths are stored in a database and, according to the monitoring results, the arrangement angle of the diffraction grating 1 and the light emission angle of the light source $2_2$ are controlled by referring to the database.

Next, an embodiment of an optical amplifier using the variable wavelength light source apparatus according to the present invention will be described.

Figure 9:
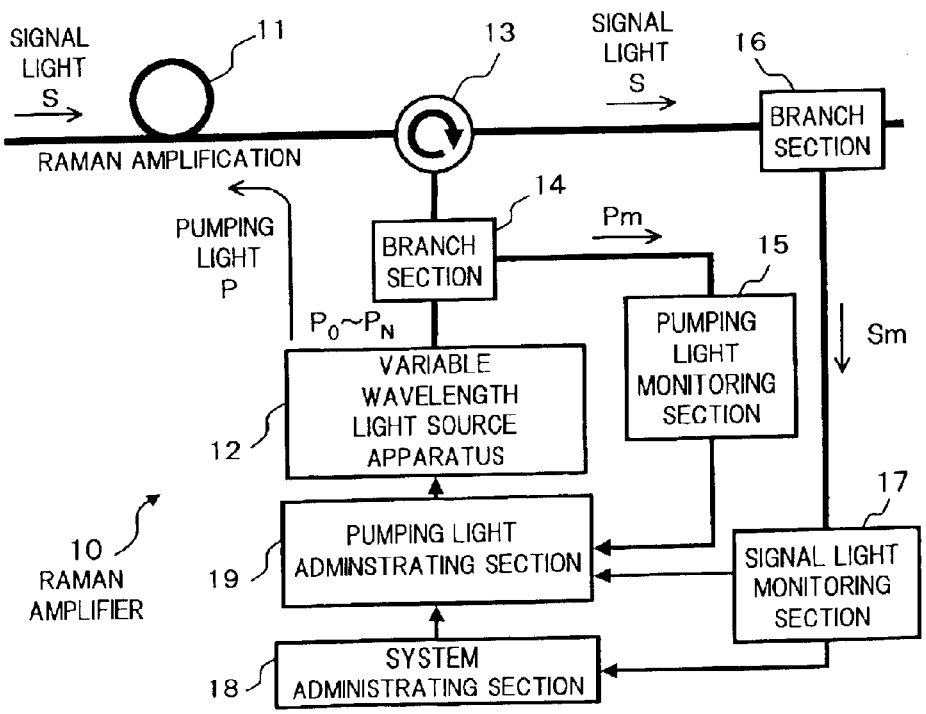
FIG. 9 is a block diagram showing a Raman amplifier using the variable wavelength light source apparatus according to the present invention as a pumping light source.

FIG. 9 is a block diagram showing an exemplary configuration of a Raman amplifier using the variable wavelength light source apparatus according to the present invention as a pumping light source.

The Raman amplifier 10 shown in FIG. 9 comprises a variable wavelength light source apparatus 12 and an optical circulator 13 for supplying pumping light P to an optical transmission path as an optical amplification medium, a branch section 14 and a pumping light monitoring section 15 for monitoring supply conditions of the pumping light P, a branch section 16 and a signal light monitoring section 17 for monitoring WDM signal light S that has been propagated through the optical transmission path 11 to be Raman amplified, a system administrating section 18 for creating information about transmission quality of the WDM signal light (transmission quality information) and information about operating conditions of a system connected to the present Raman amplifier 10 (system operation information) to administrate each information, and a pumping light administrating section 19 for controlling a drive section of the variable wavelength light source apparatus 12 according to the monitoring results of the signal light monitoring section 17 and the administrating information of the system administrating section 18.

Note, the constitution of this Raman amplifier 10 is basically the same as that of the Raman amplifier disclosed in Japanese Patent Application 2002-10298 that is a prior application filed by the present applicant. But, the present Raman amplifier differs from the prior application in that the variable wavelength light source apparatus 12 is used as the pumping light source and the multiplexer.

For the variable wavelength light source apparatus 12, the variable wavelength light source apparatus according to the first or second embodiment described above is used, wherein the number of the provided light sources is generalized to be N in number, and pumping light $P_0$–$P_N$ of N waves with different wavelengths are multiplexed to be output. As described above, the variable wavelength light source apparatus can vary wavelengths $\lambda_0$–$\lambda_N$ of the pumping light $P_0$–$P_N$ continuously over a wideband by changing the arrangement angle of the diffraction grating 1 and further the light emission angle of each light source, and at the same time, it can change the power of each pumping light $P_0$–$P_N$ by changing the gain in the gain medium 2A of each light source by adjusting the supply amount of the driving current, for example.

The optical circulator 13 is for supplying the pumping light P that has been output from the variable wavelength light source apparatus 12 and has passed through the branch section 14 to the optical transmission path 11 (the amplification medium). Here, the optical circulator 13 supplies the pumping light P to the optical transmission path 11 so that a propagation direction of the pumping light P is opposite to a propagation direction of the WDM signal light S. Also, the optical circulator 13 passes therethrough the WDM signal light S that has been propagated through the optical transmission path 11 and Raman amplified, to transmit the light S to an optical path at an output side.

Here, although the pumping light is supplied to the optical transmission path 11 using the optical circulator 13, a WDM coupler (fused type), a multiplex interference film and the like may be used instead of the optical circulator 13. Further, as a specific example of the optical transmission path 1, a highly nonlinear fiber, a silica-based fiber can also be used.

The branch section 14 branches a part of the pumping light P output from the variable wavelength light source apparatus 12 as monitoring light Pm to output it to the pumping light monitoring section 15. The pumping light monitoring section 15 supervises the power and spectrum of the pumping light P based on the monitoring light Pm from the branch section 14 and transmits the supervisory result to the pumping light administrating section 19.

The branch section 16 branches a part of the WDM signal light that has passed through the optical circulator 13 as monitoring light Sm, to output it to the signal light monitoring section 17. The signal light monitoring section 17 supervises an output condition of the Raman amplified WDM signal light S based on the monitoring light Sm from the branch section 16 and transmits the supervisory result to the system administrating section 18. Also, the signal light monitoring section 17 detects a supervisory signal included in the WDM signal light S, using the monitoring light Sm from the branch section 16, and transmits the detected supervisory signal to the system administrating section 18.

The system administrating section 18 creates the transmission quality information based on an optical S/N ratio, an output level and the like monitored by the signal light monitoring section 17, and also, creates the system operation information based on the supervisory signal detected by the signal light monitoring section 17, to send each information to the pumping light administrating section 19. Here, specific examples of the transmission quality information may include, for example, the optical S/N ratio, an inter-channel deviation, and the optical power level of the Raman amplified WDM signal light S. On the other hand, specific examples of the system operation information may include, for example, the wavelength band and the number of the WDM signal light S, an input level of the signal light to the optical transmission path, and the type of the optical transmission path.

The pumping light administrating section 19 calculates optimal supply conditions of the pumping light for realizing the Raman amplification capable of corresponding to a change in the operating conditions without affecting services in operation, according to the transmission quality information and the system operation information from the system administrating section 18. Then, the pumping light administrating section 19 sets the calculation result to a target value (an initial value), to control the wavelength and power of the pumping light generated in the variable wavelength light source apparatus 12. Further, based on the monitoring result from the pumping light monitoring section 15, the pumping light administrating section 19 feedback controls the variable wavelength light source apparatus 12 so that the pumping light P actually supplied coincides with the above target value.

Next, an operation of the Raman amplifier 10 as described above will be described.

In this Raman amplifier 10, basically, the pumping light P the wavelength and power of which are controlled by the pumping light administrating section 19 is supplied to the optical transmission path 11 by the optical circulator 13, to be propagated within the optical transmission path 11 in an opposite direction to the propagation direction of the WDM signal light S. Then, the WDM signal light S being propagated through the optical transmission path 11 is amplified up to a required level due to the Raman effect by the pumping light P and the Raman amplified WDM signal light S is sent through the optical circulator 13 to the optical path at the output side. The supervisory signal is carried on this WDM signal light S, by the low-frequency intensity modulation or the use of a channel other than the signal light, for example. The supervisory signal is detected by the signal light monitoring section 17 via the branch section 16, to be transmitted to the system administrating section 18. Based on the detected supervisory signal, the system administrating section 18 judges the operating conditions such as the wavelength band of the WDM signal light S as described above to create the system operation information.

Then, when the system administrating section 18 judges that the system operating conditions are changed, the supply conditions of the pumping light P output from the variable wavelength light source apparatus 12 are optimized according to the change in the system operating conditions. For example, in the case where signal light on a shorter wavelength side is added to the WDM signal light S, in order to Raman amplify the signal light of the new wavelength band, the wavelength of the pumping light is required to be shifted to the shorter wavelength side. More specifically, when the system operating conditions are changed such that the wavelength band of the WDM signal S is varied from 1530 nm–1600 nm to 1490 nm–1600 nm (so called addition of S-band), in the case where the oscillation wavelengths corresponding to, for example, three light sources $2_1$, $2_2$ and $2_3$ of the variable wavelength light source apparatus 12 are shifted from 1430 nm, 1450 nm and 1490 nm before being varied to 1395 nm, 1415 nm and 1455 nm after being varied, respectively, if 5000 grooves per 1 cm are formed on the diffraction grating used for the variable wavelength light source apparatus 12, it becomes possible to realize the shift of pumping wavelength as described above by changing the arrangement angle of the diffraction grating by 1.437°.

In the above case, it is considered that the optical power of the signal light on a longer wavelength side may be increased by receiving an energy shift from the signal light on the shorter wavelength side due to a stimulated Raman scattering (SRS) effect of signal light, wherein it may be effective to assign a higher priority of pumping wavelength shift to the shorter wavelength side than the longer wavelength side. In such a case, the arrangement angle of the diffraction grating is changed and also the light emission angles of the respective light source are changed sequentially in accordance with the priority, so that the order to shift the pumping wavelength as described above can also be controlled.

Further, in the case where the length of the optical transmission path 11 is changed, for example, the longer the optical transmission path is, the stronger the above SRS effect of signal light is caused, leading a necessity of amplifying more greatly the signal light on the shorter wavelength side. Therefore, it is required to shift the pumping light to the shorter wavelength side according to the extension of the length of the optical transmission path 11. More specifically, when the system operating conditions are changed such that a loss per 1 span is varied from 20 dB to 25 dB due to the extension of the optical transmission path 11, in the case where the oscillation wavelengths corresponding to, for example, three light sources $2_1$, $2_2$ and $2_3$ of the variable wavelength light source apparatus 12 are shifted from 1430 nm, 1450 nm and 1490 nm before being varied to 1425 nm, 1445 nm and 1485 nm after being varied, respectively, if 5000 grooves per 1 cm are formed on the diffraction grating used for the variable wavelength light source apparatus 12, it becomes possible to realize the shift of the pumping wavelength as described above by changing the arrangement angle of the diffraction grating by 0.208°.

Still further, when the number of signal light included in the WDM signal light S is changed significantly, for example, it is required to control the pumping light according to such a change. More specifically, when the system operating conditions are changed such that the number of signal light is changed from 88 channels of full-channels to two channels of the shortest and longest wavelengths, in the case where the oscillation wavelengths corresponding to, for example, three light sources $2_1$, $2_2$ and $2_3$ of the variable wavelength light source apparatus 12 are shifted from 1430 nm, 1450 nm and 1490 nm before being varied to 1425 nm and 1495 nm after being varied, respectively, at first, the drive of the optical source $2_2$ is stopped to turn off the pumping light with the wavelength of 1450 nm. Then, if 5000 grooves per 1 cm are formed on the diffraction grating used for the variable wavelength light source apparatus 12, the pumping wavelength corresponding to the light source $2_1$ is shifted to 1425 nm by changing the arrangement angle of the diffraction grating by 0.205° and thereafter, the pumping wavelength corresponding to the light source $2_3$ is shifted to 1495 nm by changing the light emission angle of the light source $2_3$ by −0.429°.

As for a specific control method of the pumping wavelength according to the change in the system operating conditions as described above, refer to Japanese Patent Application 2002-10298 mentioned above, which discloses in detail such a control method. Here, a basic content of the control method disclosed in the prior application will be described briefly with reference to a flowchart in FIG. 10.

Figure 10:
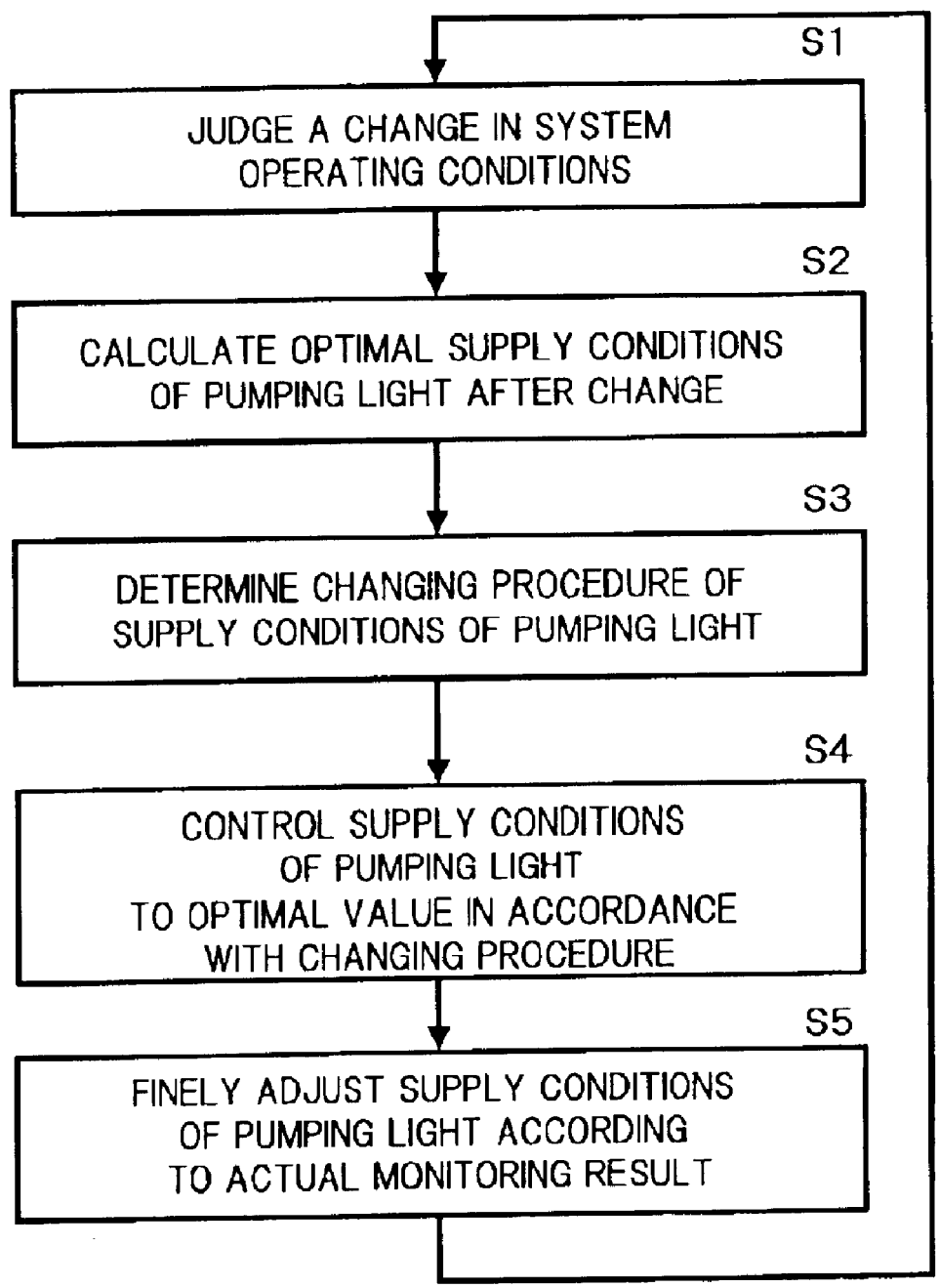
FIG. 10 is a flow chart for explaining an example of a specific control method of a pumping wavelength according to a change in system operating conditions, for the Raman amplifier shown in FIG. 9.

First, in Step 1 (depicted as S1 in the figure, and the same rule is applied hereinafter) of FIG. 10, if the system operation information indicating the change in operating conditions is transmitted from the system administrating section 18 to the pumping light administrating section 19, the control proceeds to Step 2, wherein optimal supply conditions of the pumping light P after the change in the operating conditions are calculated in the pumping light administrating section 19. In such calculation of the optimal supply conditions, optimal values of the wavelength and power of the pumping light P corresponding to the system operating conditions after the change are obtained by, for example, referring to the database registered in the pumping light administrating section 19 in advance.

Further, in Step 3, in the pumping light administrating section 19, it is judged how the supply conditions of the pumping light P before the change in the operating conditions are to be shifted to the supply conditions of the pumping light P after the change in the operating conditions calculated in Step 2, to determine a procedure for changing the wavelength and power of the pumping light P capable of holding required transmission quality without affecting services in operation.

Then, in Step 4, the pumping light administrating section 19 controls the operation of the variable wavelength light source apparatus until the supply conditions of the pumping light P achieve the optimal values after the change calculated in Step 2 while synchronizing with the change with time in the operating conditions, in accordance with the changing procedure determined in Step 3.

Further, in Step 5, the variable wavelength light source apparatus 12 is feedback controlled so that the condition of the pumping light P that is actually supplied coincides with the target value, according to the monitoring result of the pumping light monitoring section 15. And at the same time, according to the transmission quality information created in the system administrating section 18 based on the monitoring result of the signal light monitoring section 17, the supply conditions of the pumping light P are finely adjusted so that the transmission quality of the WDM signal light S that has been Raman amplified actually is maintained in a good condition.

In the procedure for changing the supply conditions of the pumping light P determined in Step 3 above, it is preferable to, as a first step, determine a procedure for changing the wavelength setting of the pumping light P before the change in operating conditions to the wavelength setting of the pumping light P after the change in operating conditions, and then, as a second step, to determine a procedure for changing the wavelength and power of the pumping light P in consideration of the maintenance of transmission quality of each channel light in operation.

In the above first step, for example, it is desired to obtain a difference between each pumping wavelength before the change and each pumping wavelength after the change calculated as the optimal value, and then to change the wavelength setting of the light sources so as to correspond to the pumping wavelength of small difference. Here, if the obtained difference exceeds the variable wavelength range of the pumping light source, a new light source is activated.

In the above second step, basically, a procedure for adjusting the variable wavelength light source apparatus 12 is determined so that the wavelength and power of each pumping light $P_1$–$P_N$ is adjusted in parallel with each other while synchronizing with the change with time in the system operating conditions. Further, it is desirable to determine the changing procedure so as to maintain the transmission quality of each channel light in operation by assigning a priority of adjustment to each pumping light $P_1$–$P_N$, that is, by assigning a lower priority of adjustment to the pumping light less affecting the transmission quality.

As a condition that the higher priority of adjustment is assigned, such a case is considered where, for example, when the wavelength of particular pumping light before the change in the operating conditions coincides with or approximates to the wavelength of the signal light after the change in the operating conditions, the higher priority of control is assigned to the particular pumping light than the other pumping light so that the wavelength of the particular pumping light is shifted before the operation of the signal light is started. Further, for example, it is also considered that the higher priority of control is assigned to the pumping light responsible for Raman amplification of a signal light band that is in progress of transition of its operating conditions than the other pumping light so as to respond to the change in the operating conditions more securely.

In order to perform adjustment of the pumping light using such a priority as described above, for example, information about the priority setting and an assumed adjustment method are compiled into a database in advance so that the changing procedure of the arrangement setting of the variable wavelength light source apparatus 12 is determined based on this information. As the assumed adjustment method mentioned above, for example, in the case where a wavelength of particular pumping light is shifted, since a Raman gain of the wavelength band, for which the particular pumping light of the wavelength before the shift is responsible, is reduced, it is considered to perform adjustment so as to increase the power of pumping light of a wavelength nearer to the wavelength before the shift of the particular pumping light. Further, for example, when the power of pumping light of a particular wavelength may be increased, the power of pumping light of a wavelength nearer to the particular wavelength may be decreased.

According to the Raman amplifier 10 as described above, the variable wavelength light source apparatus 12 capable of varying continuously the oscillation wavelengths of N waves over a wideband. Thus, even if the system operating conditions are changed dynamically, since the wavelength and power of each pumping light $P_1$–$P_N$ can be optimized according to the change, it is possible to change a condition of Raman amplification without affecting services in operation. Therefore, it becomes possible to realize the Raman amplifier capable of flexibly corresponding to WDM signal light operated in a wide wavelength band.

It is to be noted that an optical amplifier using the variable wavelength light source apparatus according to the present invention as a pumping light source is not limited to the Raman amplifier constituted as described above, but the variable wavelength light source apparatus according to the present invention can be applied to typical Raman amplifiers of known constitution, or moreover, to various optical amplifiers using a plurality of pumping light of different wavelengths.

What is claimed is:

1. A variable wavelength light source apparatus for multiplexing a plurality of variable wavelength light to output multiplexed light, comprising:
   a wavelength selection device in which a propagation direction of emitted light is changed according to a wavelength of incident light;
   a plurality of light source sections, each including a gain medium that amplifies light and a reflection component that reflects the light incident on one end and emitted from the other end of said gain medium, to return the light to the other end, and emitting the light that has reciprocated in said gain medium and has been amplified, to a predetermined position of said wavelength selection device at angles different from each other;

an optical resonance reflection section including a light incident surface on which the emitted light from said wavelength selection device enters, that reflects a part of the light incident vertically on said light incident surface to form an optical resonator configuration between said optical resonance reflection section and each of the reflection components of said light source sections, to generate oscillation light;

an optical coupler section coupling the oscillation light transmitted through said optical resonance reflection section in an output light path; and a wavelength selection device drive section changing an arrangement angle of said wavelength selection device with respect to said optical resonance reflection section with said predetermined position as a center.

2. A variable wavelength light source apparatus according to claim 1, further comprising a light source drive section changing an emission angle of the light directed to the predetermined position of said wavelength selection device, for at least one or more of said plurality of the light source sections.

3. A variable wavelength light source apparatus according to claim 1, further comprising:

a monitoring section detecting a wavelength of the oscillation light coupled in said output light path; and a control section controlling said wavelength selection device drive section according to the wavelength detected by said monitoring section.

4. A variable wavelength light source apparatus according to claim 2, further comprising:

a monitoring section detecting a wavelength of the oscillation light coupled in said output light path; and a control section controlling at least one of said wavelength selection device drive section or said light source drive section according to the wavelength detected by said monitoring section.

5. A variable wavelength light source apparatus according to claim 1, wherein said wavelength selection device is a diffraction grating.

6. A variable wavelength light source apparatus according to claim 5, wherein said diffraction grating is a reflection type diffraction grating.

7. A variable wavelength light source apparatus according to claim 5, wherein said diffraction grating is a transmission type diffraction grating.

8. A variable wavelength light source apparatus according to claim 1, wherein each of said light source sections includes a semiconductor laser.

9. An optical amplifier using a variable wavelength light source apparatus recited in claim 1 as a pumping light source.

10. An optical amplifier according to claim 9, wherein pumping light output from said variable wavelength light source apparatus is supplied to an amplification medium using a silica-based fiber and signal light being propagated through said amplification medium is Raman amplified.

11. An optical amplifier according to claim 10, wherein supply conditions of pumping light from said variable wavelength light source apparatus are controlled based on information indicating operating conditions with regard to transmission of the signal light, while synchronizing with a change with time in said operating conditions.

* * * * *